(12) United States Patent
Fukuda

(10) Patent No.: US 7,763,812 B2
(45) Date of Patent: Jul. 27, 2010

(54) SEMICONDUCTOR DEVICE CAPABLE OF SWITCHING OPERATION MODES

(75) Inventor: Hiroyoshi Fukuda, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 160 days.

(21) Appl. No.: 12/222,642

(22) Filed: Aug. 13, 2008

(65) Prior Publication Data

US 2009/0242268 A1 Oct. 1, 2009

(30) Foreign Application Priority Data

Mar. 31, 2008 (JP) ............................. 2008-089789

(51) Int. Cl.
*H01L 23/49* (2006.01)
*H05K 5/06* (2006.01)
(52) U.S. Cl. ..................... 174/538; 257/695; 257/784; 174/551
(58) Field of Classification Search ................ 257/691, 257/695, 784; 174/538, 528, 551
See application file for complete search history.

(56) References Cited

U.S. PATENT DOCUMENTS

| | | | |
|---|---|---|---|
| 5,754,879 A | 5/1998 | Johnston | |
| 5,859,387 A * | 1/1999 | Gagnon | 174/531 |
| 5,986,209 A * | 11/1999 | Tandy | 174/530 |
| 6,080,932 A * | 6/2000 | Smith et al. | 174/524 |
| 6,770,982 B1 * | 8/2004 | Liou | 257/784 |
| 6,787,915 B2 * | 9/2004 | Uchida et al. | 257/777 |
| 6,806,559 B2 * | 10/2004 | Gann et al. | 257/672 |
| 6,841,863 B2 * | 1/2005 | Baik et al. | 257/686 |
| 6,847,116 B2 * | 1/2005 | Isokawa | 257/736 |
| 6,870,243 B2 * | 3/2005 | Elliott et al. | 257/666 |
| 7,307,352 B2 * | 12/2007 | Choi | 257/786 |
| 7,405,486 B2 * | 7/2008 | Kato | 257/777 |
| 7,414,320 B2 * | 8/2008 | Ohie | 257/784 |
| 7,671,451 B2 * | 3/2010 | Lee et al. | 257/666 |

* cited by examiner

*Primary Examiner*—Hung V Ngo
(74) *Attorney, Agent, or Firm*—McGinn IP Law Group, PLLC

(57) ABSTRACT

A semiconductor device according to the present invention includes first through fourth internal terminals placed along the perimeter of a substrate, a circuit coupled to the first internal terminal, a first external terminal coupled to the second internal terminal, a second external terminal coupled to the third internal terminal, and a third external terminal coupled to the fourth internal terminal. The circuit outputs a signal indicative of a connection state the first internal terminal and the first external terminal. A distance between centers of the first and second internal terminals is L1 in a direction parallel to one side of the substrate beside which the first external terminal is placed. A distance between centers of the third and fourth internal terminals is L2 in a direction parallel to one side of the substrate beside which the second and third external terminals are placed. The distance L1 is set smaller than the distance L2. With this structure, compared to a case where all internal terminals are spaced apart by the distance L1, the length of the periphery of the substrate which is determined by the number of internal terminals is reduced by L2−1. As a result, the area of the substrate can be reduced.

19 Claims, 15 Drawing Sheets

SEMICONDUCTOR DEVICE CAPABLE OF SWITCHING OPERATION MODES

BACKGROUND OF THE INVENTION

1. Field of the Invention

The present invention relates to a semiconductor device, and more particularly, to a semiconductor device that switches operation modes based on the presence or absence of bonding.

2. Description of the Related Art

It is a common practice to form circuits for implementing different multiple functions on a substrate (chip) in advance, select a specific function that meets the user's request upon assembly into a semiconductor device, and customize the semiconductor device by activating a circuit that has the selected function. With this, a semiconductor device that fulfills users' individual requests can be manufactured while reducing the total manufacture cost by making a general-purpose chip.

U.S. Pat. No. 5,754,879 describes a technology of selecting any one of multiple operation modes based on whether or not an external terminal (power supply external terminal, ground external terminal, or reset external terminal) is bonded to an internal terminal (mode pad), which is provided on a chip for operation mode selection. This technology enables a semiconductor device to select an operation mode only based on the presence or absence of bonding without newly installing an external terminal through which special signals for operation mode selection are supplied.

Internal terminals through which signals are input from and output to the outside of a chip are placed along the perimeter of the chip. In a central area of the chip that is surrounded by the pads, various circuits are formed. The recent advancement in miniaturization and multi-layer wiring has made it possible to mount numerous circuits to a chip. However, a chip cannot have more circuits without an accompanying increase in the number of pads required to be placed along the perimeter of the chip and, for some products, the number of pads required to be placed along the perimeter of the chip determines the chip size.

The present inventor has recognized that, in a chip where various circuits for satisfying individual users' requests and mode pads for operation mode selection are mounted, adding a mode pad increases the chip size. Specifically, what is important is to keep the chip size from increasing while trying to meet requests of users as much as possible by mounting circuits that implement different multiple functions to the chip.

SUMMARY

The present invention seeks to solve one or more of the above problems, or to improve upon those problems at least in part.

In one embodiment, a semiconductor device according to the present invention includes: a substrate; a first internal terminal, a second internal terminal, a third internal terminal, and a fourth internal terminal which are placed along perimeter of the substrate; a circuit formed on the substrate and coupled to the first internal terminal; a first external terminal coupled to the second internal terminal; a second external terminal coupled to the third internal terminal; and a third external terminal coupled to the fourth internal terminal and placed beside one side of the substrate where the second external terminal is located. The circuit outputs a signal indicative of a connection state between the first internal terminal and the first external terminal. A distance between centers of the first internal terminal and the second internal terminal is L1 in a direction parallel to one side of the substrate beside which the first external terminal is placed. A distance between centers of the third internal terminal and the fourth internal terminal is L2 in a direction parallel to the one side of the substrate beside which the second external terminal and the third external terminal are placed. In this case, the distance L1 is set smaller than the distance L2.

With this structure, compared to a case where all internal terminals are spaced apart by the distance L1, the length of the periphery of the substrate which is determined by the number of internal terminals is reduced by L2−L1.

Therefore, when a product whose substrate size is determined by the number of internal terminals required to be placed along the perimeter of the substrate is to meet users' individual requests by adding an operation mode selection internal terminal, the substrate can be smaller in an area according to the present invention where an operation mode selection internal terminal and an internal terminal connected to an external terminal that is in some cases connected to the operation mode selection internal terminal are at the distance L2 from each other, than in a case where those internal terminals are spaced apart by the distance L1.

In another embodiment, a semiconductor device according to the present invention includes: a substrate; a first internal terminal, a second internal terminal, a third internal terminal, and a fourth internal terminal which are placed along perimeter of the substrate; and a circuit formed on the substrate and coupled to the first internal terminal. The first internal terminal and the second internal terminal are connectable to a first external terminal. The third internal terminal is connectable to a second external terminal. The fourth internal terminal is connectable to a third external terminal. The circuit outputs a signal indicative of a connection state between the first internal terminal and the first external terminal is. A distance between centers of the first internal terminal and the second internal terminal is L1 in a direction parallel to one side of the perimeter of the substrate where one of the first internal terminal and the second internal terminal is placed. A distance between centers of the third internal terminal and the fourth internal terminal is L2 in a direction parallel to one side of the perimeter of the substrate where the third internal terminal and the fourth internal terminal are placed. In this case, the distance L1 is set smaller than the distance L2.

With this structure where the interval between some of internal terminals is L1, which is a shorter distance than L2, the length of the periphery of the substrate which is determined by the number of internal terminals is reduced that much.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes. Identical components are denoted by the same reference symbols in order to avoid repetitive descriptions.

First Embodiment

Figure 1:
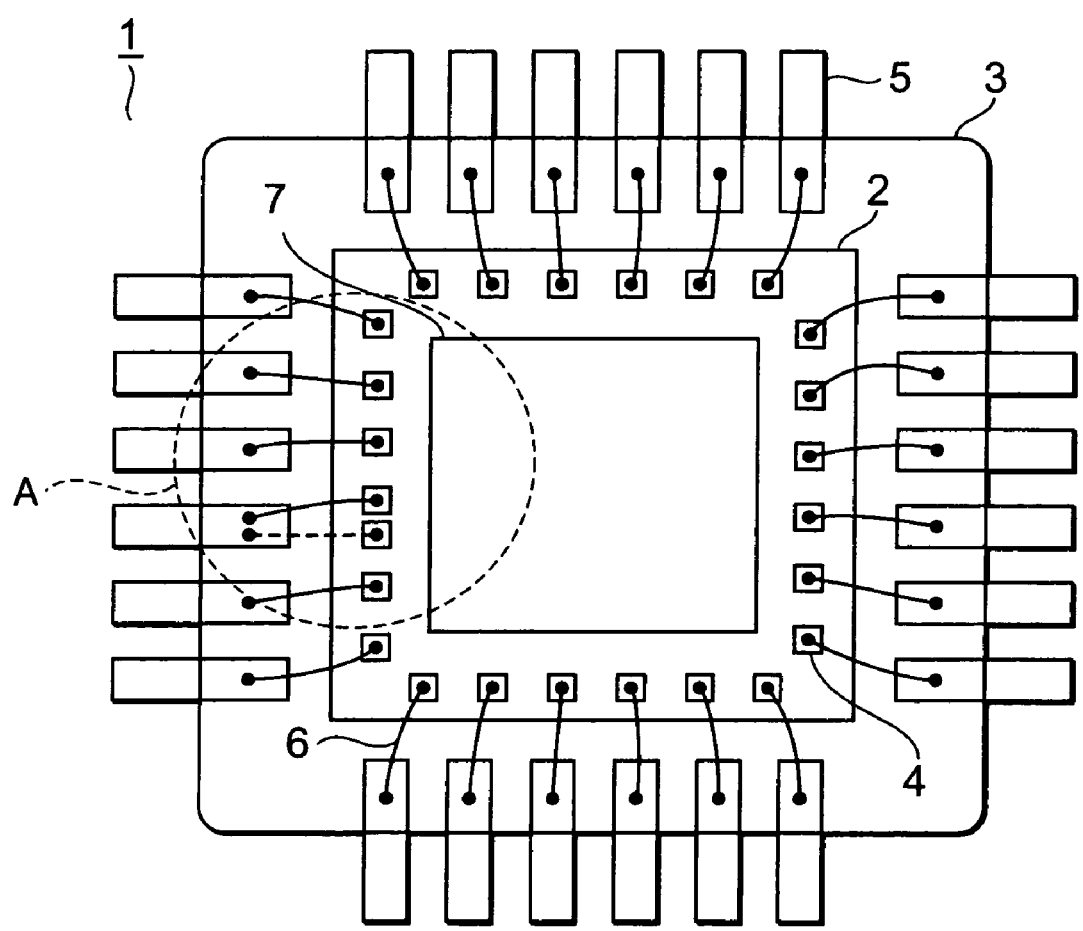
FIG. 1 is a structural diagram of a semiconductor device according to a first embodiment of the present invention.

FIG. 1 is a structural diagram of a semiconductor device 1 according to a first embodiment of the present invention. As shown in FIG. 1, the semiconductor device 1 has a substrate (chip) 2, multiple bonding wires 6, multiple external terminals (leads) 5 respectively connected to the chip 2 by the multiple bonding wires 6, and a mold resin 3.

Multiple internal terminals (pads) 4 are placed along the perimeter of the chip 2. An internal circuit 7 is formed in an area on the chip 2 that is within the square of the pads 4. The internal circuit 7 contains an operation mode selection circuit, and functional blocks (for example, a central processing unit (CPU), a memory, and peripheral circuits (an input/output circuit, a protection circuit, and the like)) as well.

The pads 4 include a pad for operation mode selection (mode pad) in addition to usual pads such as a pad to which a power supply electric potential is supplied, a pad connected to a ground electric potential, a pad to which a reset signal is input, and a pad for communicating input/output signals. The mode pad is connected to the operation mode selection circuit within the internal circuit 7, and the operation mode selection circuit selects a specific operation mode from among multiple operation modes based on whether bonding to the mode pad is detected or not. Note that when an external terminal (lead) is bonded to the mode pad, two bonding wires 6 are connected to one lead 5 as shown in FIG. 1.

By selecting an operation mode, bus protocol settings (for example, whether it is an operation mode in which data is output in one bit or an operation mode in which data is output in four bits is set), reliability level settings (for example, whether it is an operation mode that enables an error correction function or an operation mode that disables the error correction function is set), and the like can be enabled. The initially set operation mode thus makes the semiconductor device 1 operate in a manner that meets the user's request.

Figure 2:
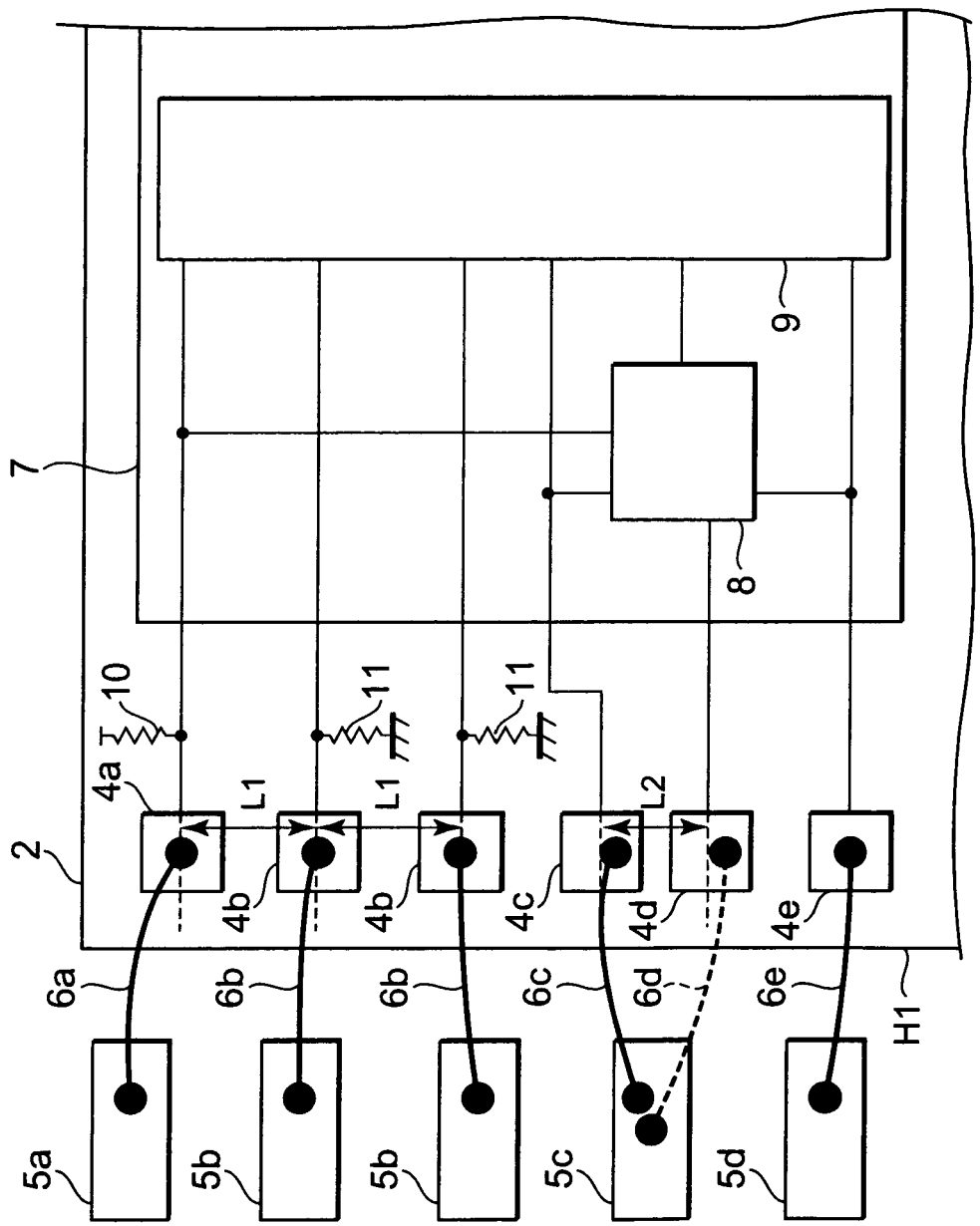
FIG. 2 is a detailed structural diagram of the semiconductor device according to the first embodiment of the present invention.

FIG. 2 shows details of a portion A circled by the dotted line shown in FIG. 1. The leads 5 include next four types of leads, 5a to 5d. The lead 5a is a reset external terminal for inputting a reset signal from the outside into the chip 2. The lead 5b is a signal external terminal for communicating input/output signals between the chip 2 and the outside. The lead 5c is a power supply external terminal for supplying a power supply electric potential to the chip 2. The lead 5d is a ground external terminal connected to an external ground electric potential.

The pads 4 include next five types of pads 4a to 4e. The pad 4a is a reset internal terminal (reset pad) which is connected to the lead 5a by the bonding wires 6a to receive a reset signal. The pad 4a is pulled up (because it is low-active (active LOW)) by a pull-up resistor 10 to output the reset signal to the operation mode selection circuit 8, and the functional block 9.

The pad 4b is a signal internal terminal (signal pad) which is connected to the lead 5b by one of the bonding wires 6b to communicate input/output signals. The pad 4b is pulled down by a pull-down resistor 11 (or by a pull-up resistor instead), and connected to the functional block 9.

The pad 4c is a power supply internal terminal (power supply pad) which is connected to the lead 5c by one of the bonding wires 6c to receive a power supply electric potential. The pad 4c outputs a power supply electric potential supplied from the outside to the operation mode selection circuit 8 and the functional block 9.

The pad 4d is an internal terminal for operation mode selection (mode pad) and is connected to the operation mode selection circuit 8. The pad 4d and the lead 5c are bonded to each other in some cases and not bonded in other cases. Whether the lead 5c and the pad 4d are bonded or not is utilized in selecting an operation mode. In the drawings, the bonding wire 6 that connects the pad 4d to the lead 5c is represented by a dotted line since the lead 5c and the pad 4d are not always bonded.

The pad 4e is a ground internal terminal (ground pad) which is connected to the lead 5d by one of the bonding wires 6 to be connected to a ground electric potential. The pad 4e is connected to the operation mode selection circuit 8 and the functional block 9.

The functional block 9 is connected to the pads 4 (pads 4a, 4b, 4c, and 4e), and an output (operation mode switching signal) from the operation mode selection circuit 8 is input to the functional block 9. The functional block 9 causes the circuit to operate in an operation mode that is selected in accordance with the input operation mode switching signal.

As shown in FIG. 2, the interval between normal pads, specifically, the distance from the center of the pad 4a to the center of the pad 4b that is immediately next to the pad 4a, or the distance between the centers of the adjacent pads 4b, is given as L1. The interval between a mode pad and a normal pad that may be bonded to the same lead as this mode pad, specifically, the distance from the center of the pad 4c to the center of the pad 4d, is given as L2. Note that of the distances L1 and L2, only components that are of consideration are ones in a direction parallel to one side of the chip 2 beside which a lead that is bonded (is bonded in some cases and not bonded in other cases) to the pads 4 is placed (H1 in FIG. 2). In the present invention, the distances L1 and L2 satisfy a relation L1>L2. A direction parallel to H1 of FIG. 2 may also be expressed as a direction parallel to one side of the perimeter of the chip 2 where the pads 4 are arranged, since the pads 4 are placed along the perimeter of the chip 2.

The distance L1 and the distance L2 will be described in detail with reference to FIGS. 3 to 10. The pad 4a and the pad 4b are taken here as an example for describing the distance L.

The distance L1 maybe long enough to keep adjacent bonding wires 6 from coming into contact with each other, or a distance at which the probability of adjacent bonding wires 6 coming into contact with each other is low. The bonding wires 6 can come into contact with each other in the following two cases.

The first case is that, when the chip 2 is sealed with the mold resin 3, the resin sweeps the bonding wires 6 away from their original locations, bringing them into contact with neighboring bonding wires 6. If the interval between adjacent pads 4 is too narrow, the distance between the bonding wires 6 that are connected to those pads 4 is accordingly closer, and a slight positional shift of the bonding wires 6 during resin sealing can easily cause a loose connection between the bonding wires 6.

Figure 3:
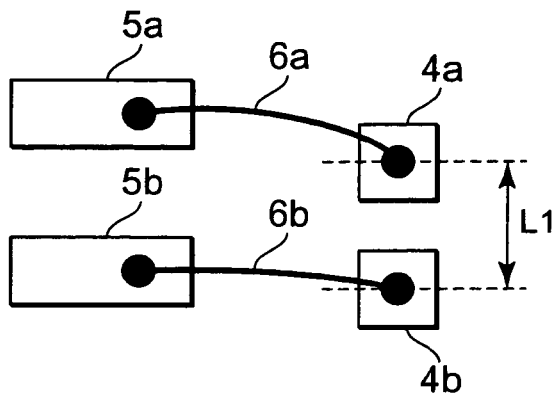
FIG. 3 is a diagram illustrating a distance L1 and distance L2 according to the first embodiment of the present invention.

FIG. 3 shows a case in which the pad interval is set to the distance L1 at which the probability of a loose connection between the bonding wires 6 is low enough. As shown in FIG. 3, with the pad interval set to the appropriate distance L1, a loose connection between the bonding wire 6a and the bonding wire 6b does not occur when the chip 2 is sealed with the mold resin 3. Note that the distance L1 in this case is determined by the relation between the length of the bonding wires 6 and the distances from the leads 5 to the pads 4 (how slack the bonding wires 6 are), the flow rate of the mold resin 3 during sealing, and the like in a comprehensive manner.

Figure 4:
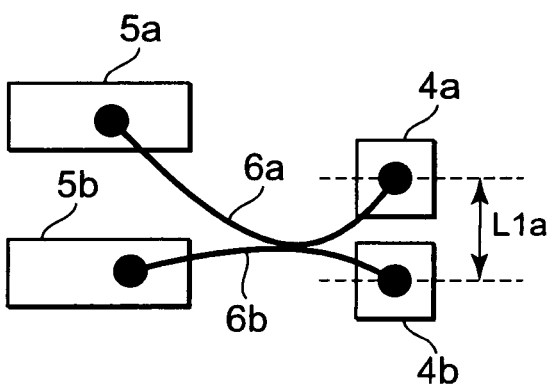
FIG. 4 is a diagram illustrating the distance L1 and distance L2 according to the first embodiment of the present invention.

FIG. 4, on the other hand, shows a case in which the pad interval is not set to the distance L1 at which the probability of a loose connection between the bonding wires 6 is low enough. In FIG. 4, the distance from the center of the pad 4a to the center of the pad 4b is L1a, which is smaller than L1 (L1a<L1). A loose connection between the bonding wire 6a and the bonding wire 6b therefore occurs during sealing with the mold resin 3. In the example of FIG. 4, the bonding wire 6a is swept away and brought into contact with the bonding wire 6b.

Figure 5:
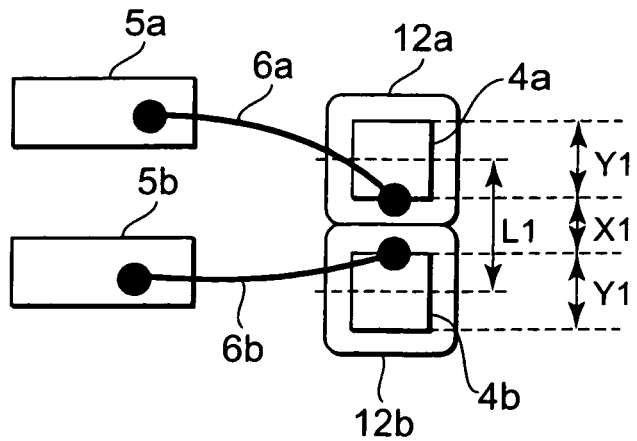
FIG. 5 is a diagram illustrating the distance L1 and distance L2 according to the first embodiment of the present invention.

The second case is a contact between the bonding wires 6 due to a mechanically-caused shift in bonding position. Misalignment to a certain extent is usual when adhering the bonding wires 6 to the pads 4. FIG. 5 shows connection ranges 12 as regions containing a range of a positional shift in connecting the bonding wires 6 to the pads 4. Here, a connection range for the connection of the bonding wire 6a to the pad 4a is denoted by 12a, and a connection range for the connection of the bonding wire 6b to the pad 4b is denoted by 12b. The pad 4a and the pad 4b in FIG. 5 are arranged such that the connection range 12a and the connection range 12b do not overlap each other. The distance from the center of the pad 4a to the center of the pad 4b is thus set to the appropriate distance L1 and, accordingly, the bonding wires 6a and 6b can be adhered to the chip 2 while avoiding a contact between the bonding wire 6a and the bonding wire 6b. Desirably, the bonding wires 6 are adhered with their tips (balls) contained completely within the pads 4 as shown in FIG. 3. However, the bonding wires 6 may be adhered with their balls resting partially the outside of the pads 4 as shown in FIG. 5, as long as electrical connection is secured.

Figure 6:
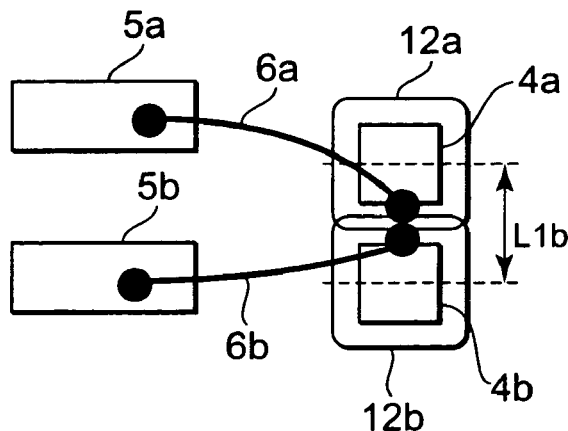
FIG. 6 is a diagram illustrating the distance L1 and distance L2 according to the first embodiment of the present invention.

FIG. 6, on the other hand, shows a case in which the connection range 12a and the connection range 12b overlap each other. The distance from the center of the pad 4a to the center of the pad 4b in this case is L1b, which is smaller than L1 (L1b<L1). The bonding wires 6a and 6b may therefore be in contact with each other when adhered to the chip 2. In the example of FIG. 6, the balls of the bonding wires 6a and 6b are adhered to the region where the connection range 12a and the connection range 12b overlap each other, and a loose connection between the bonding wire 6a and the bonding wire 6b is caused as a result.

Figure 7:
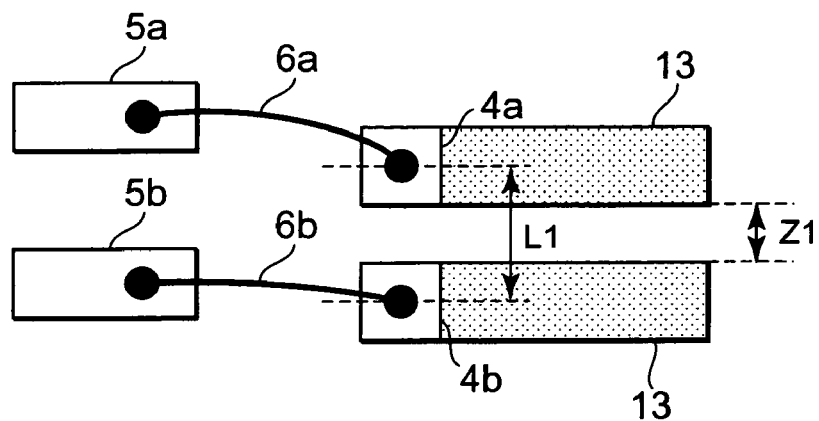
FIG. 7 is a diagram illustrating the distance L1 and distance L2 according to the first embodiment of the present invention.

When a bonding wire is to be adhered to a pad with a ball of the bonding wire contained completely within the pad, the pad size can be reduced down to the diameter of the ball of the bonding wire at minimum. In this case, assuming that the possibility of a loose contact between bonding wires during resin sealing is not taken into consideration and that a positional shift does not to occur when connecting the bonding wires to the pads, the pad interval equals to the minimum formation dimensions of the material (metal, for example) of the pads. FIG. 7 shows metal wiring lines 13, which connect the pad 4a and the pad 4b to the internal circuit 7 separately, and a wiring width Z1 of the metal wiring lines 13. As shown in FIG. 7, the interval between the pad 4a and the pad 4b can be narrowed down to Z1 at minimum.

Figure 8:
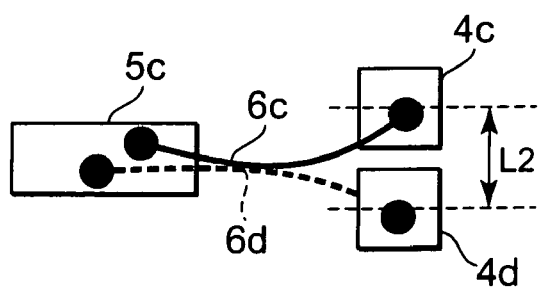
FIG. 8 is a diagram illustrating the distance L1 and distance L2 according to the first embodiment of the present invention.

The distance L2 is described next. The most significant difference from the distance L1 is that the distance L2 can be determined without taking into consideration a loose contact between the bonding wires 6. As shown in FIG. 8, the bonding wire 6c and the bonding wire 6d are connected to the same lead 5c, and a contact between the bonding wire 6c and the bonding wire 6d which could occur during resin sealing does not cause a problem. In other words, unlike the distance L1 which needs to take into consideration a loose contact between the bonding wires 6 in resin sealing, the distance L2 from the center of the pad 4c to the center of the pad 4d can be set shorter.

Figure 9:
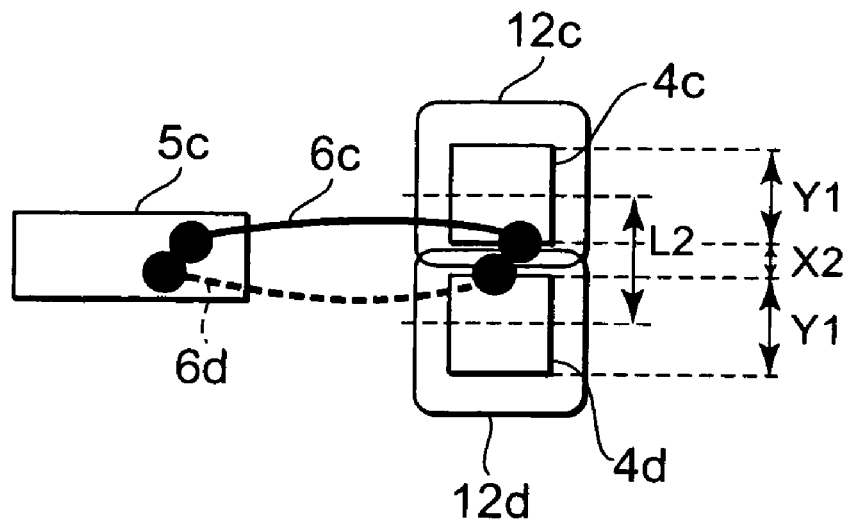
FIG. 9 is a diagram illustrating the distance L1 and distance L2 according to the first embodiment of the present invention.

The connection ranges 12 in the case of the distance L2 are discussed next as in the description of the distance L1. A connection range 12c is for the connection of the bonding wire 6c to the pad 4c and a connection range 12d is for the connection of the bonding wire 6d to the pad 4d. As shown in FIG. 9, the connection range 12c of the pad 4c and the connection range 12d of the pad 4d are allowed to overlap each other to an extent which does not allow the connection range 12c to meet the pad 4d, or which does not allow the connection range 12d to meet the pad 4c. Since the bonding wire 6c and the bonding wire 6d are connected to the same lead 5c, a ball of the bonding wire 6c and a ball of the bonding wire 6d can be in contact with each other without causing a problem when adhered to the pad 4c and the pad 4d, respectively. Therefore, no problem arises from a state in which the connection range 12c and the connection range 12d overlap each other with a part of the ball of the bonding wire 6c connected to a part of the ball of the bonding wire 6d as shown in FIG. 9.

As mentioned above, the overlap has to be limited to an extent which does not allow the connection range 12c to meet the pad 4d, or which does not allow the connection range 12d to meet the pad 4c. This is because, if the connection range 12c meets the pad 4d, the bonding wire 6c may be bonded directly to the pad 4d instead of through the bonding wire 6d. The same applies to the positional relation between the connection range 12d and the pad 4c.

In FIG. 5, the dimension of the pad 4a and the pad 4b each in a direction in which the pads 4a and 4b are lined up (longitudinal direction) is given as Y1, and the distance from an end of the pad 4a to the adjacent end of the pad 4b is given as X1. The dimension of the pad 4c and the pad 4d shown in FIG. 9 is set to Y1 as in FIG. 5. In FIG. 9 where the pad 4c and the pad 4d can be closer to each other by the overlap than the pads 4a and 4b, a distance X2 between an end of the pad 4c and the adjacent end of the pad 4d satisfies a relation X2<X1. In short, L2=Y1/2+X2+Y1/2=Y1+X2 in FIG. 9, whereas L1=Y1/2+X1+Y1/2=Y1+X1 in FIG. 5, and the distance L2 can thus be shorter than the distance L1 by X1−X2 (which corresponds to the overlap between the connection range 12c and the connection range 12d).

Figure 10:
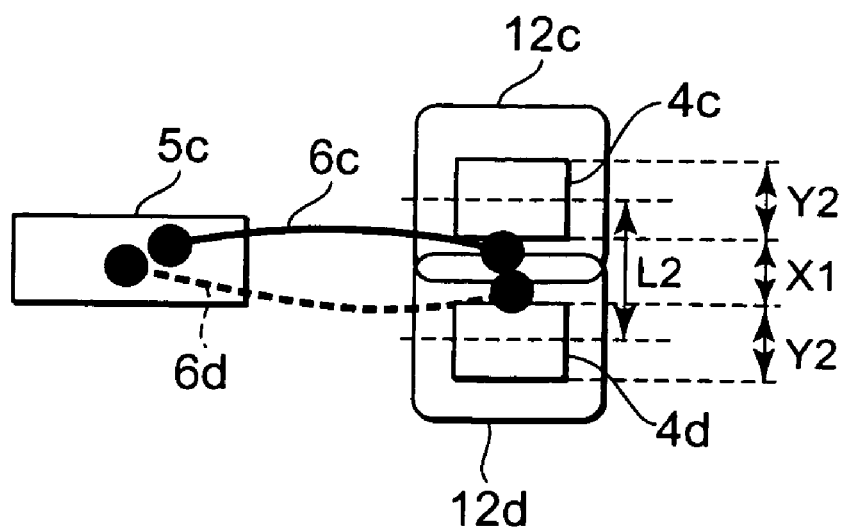
FIG. 10 is a diagram illustrating the distance L1 and distance L2 according to the first embodiment of the present invention.

FIG. 10 shows a case of employing pads that are smaller in size than the pads of FIG. 5. In FIG. 10, the dimension of the pad 4c and the pad 4d each in a direction in which the pads 4c and 4d are lined up (longitudinal direction) is given as Y2, and the distance from an end of the pad 4c to the adjacent end of the pad 4d is given as X1. Y2 is smaller than Y1 (Y2<Y1) Since the distance from an end of the pad 4c to the adjacent end of the pad 4d in FIG. 10 is X1 as in FIG. 5, the reduced size of the pads 4c and 4d in FIG. 10 creates an overlapping region between the connection range 12c and the connection range 12d, allowing the pad 4c and the pad 4d to be closer to each other by the overlap. In short, L2=Y2/2+X2+Y2/2=Y2+X1 in FIG. 10 whereas L1=Y1+X1 in FIG. 5, and the distance L2 can thus be shorter than the distance L1 by Y1−Y2 (which corresponds to the overlap between the connection range 12c and the connection range 12d).

The bonding wire 6c and the bonding wire 6d, which are connected (connected in some cases and not connected in other cases) to the same lead 5c, do not cause a problem when adhered to the pad 4c and the pad 4d, respectively, with their balls in contact with each other in the overlapping region as shown in FIG. 10. However, the bonding wire 6c and the pad 4c need to be electrically connected to each other, and it is not allowed to reduce the size of the pad 4c to the extent that the ball of the bonding wire 6c completely falls off the pad 4c. The same applies to the pad 4d.

The distance L2 from the center of the pad 4c to the center of the pad 4d can thus be shorter than the distance L1 from the center of the pad 4a to the center of the pad 4b by the overlap between the connection range 12c and the connection range 12d. In short, the pad 4c and the pad 4d are positioned in relation to each other such that the distance L2 from the center of the pad 4c to the center of the pad 4d and the distance L1 from the center of the pad 4a to the center of the pad 4b satisfy at least a relation L2<L1.

The description given next is about the operation mode selection circuit 8. Two different circuit structures are described with reference to FIGS. 11 to 14.

Figure 11:
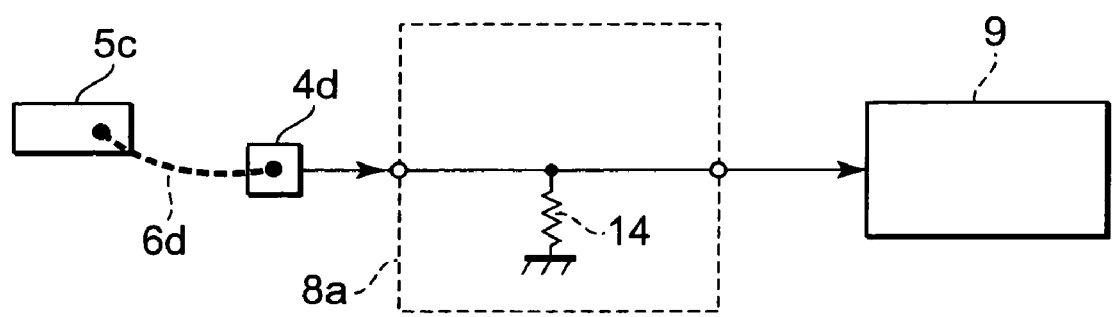
FIG. 11 is a circuit diagram of an operation mode selection circuit 8a according to the first embodiment of the present invention.

FIG. 11 is a circuit diagram of an operation mode selection circuit 8a. Power supply relations (connections with the pad 4c and the pad 4e) are omitted from the circuit diagram. The operation mode selection circuit 8a does not always need reset signals. Therefore, wiring for reset signals is omitted from FIG. 11.

The operation mode selection circuit 8a is constituted of a pull-down resistor 14. The pull-down resistor 14 is connected to the pad 4d. The operation mode selection circuit 8a receives an input of an electric potential from the pad 4d, and outputs an operation mode switching signal to the functional block 9.

The operation mode selection circuit 8a generates operation mode switching signals based on the presence or absence of the bonding wire 6d which connects the pad 4d and the lead 5c to each other. Specifically, when the pad 4d and the lead 5c are bonded by the bonding wire 6d, the pad 4d receives a power supply electric potential from the lead 5c and shifts to a voltage that indicates a logical level H. Based on the signal that indicates the logical level H, the operation mode selection circuit 8a outputs an H-level operation mode switching signal.

When the pad 4d and the lead 5c are not bonded by the bonding wire 6d, on the other hand, the pull-down resistor 14 shifts the pad 4d to an electric potential that indicates a logical level L. Based on the signal that indicates the logical level L, the operation mode selection circuit 8a outputs an L-level operation mode switching signal.

In this way, the functional block 9 receives from the operation mode selection circuit 8a one of an H-level operation mode switching signal and an L-level operation mode switching signal which reflect the presence and absence of the bonding wire 6d, respectively, and activates a circuit that implements a specific function relevant to the selected operation mode.

Figure 12:
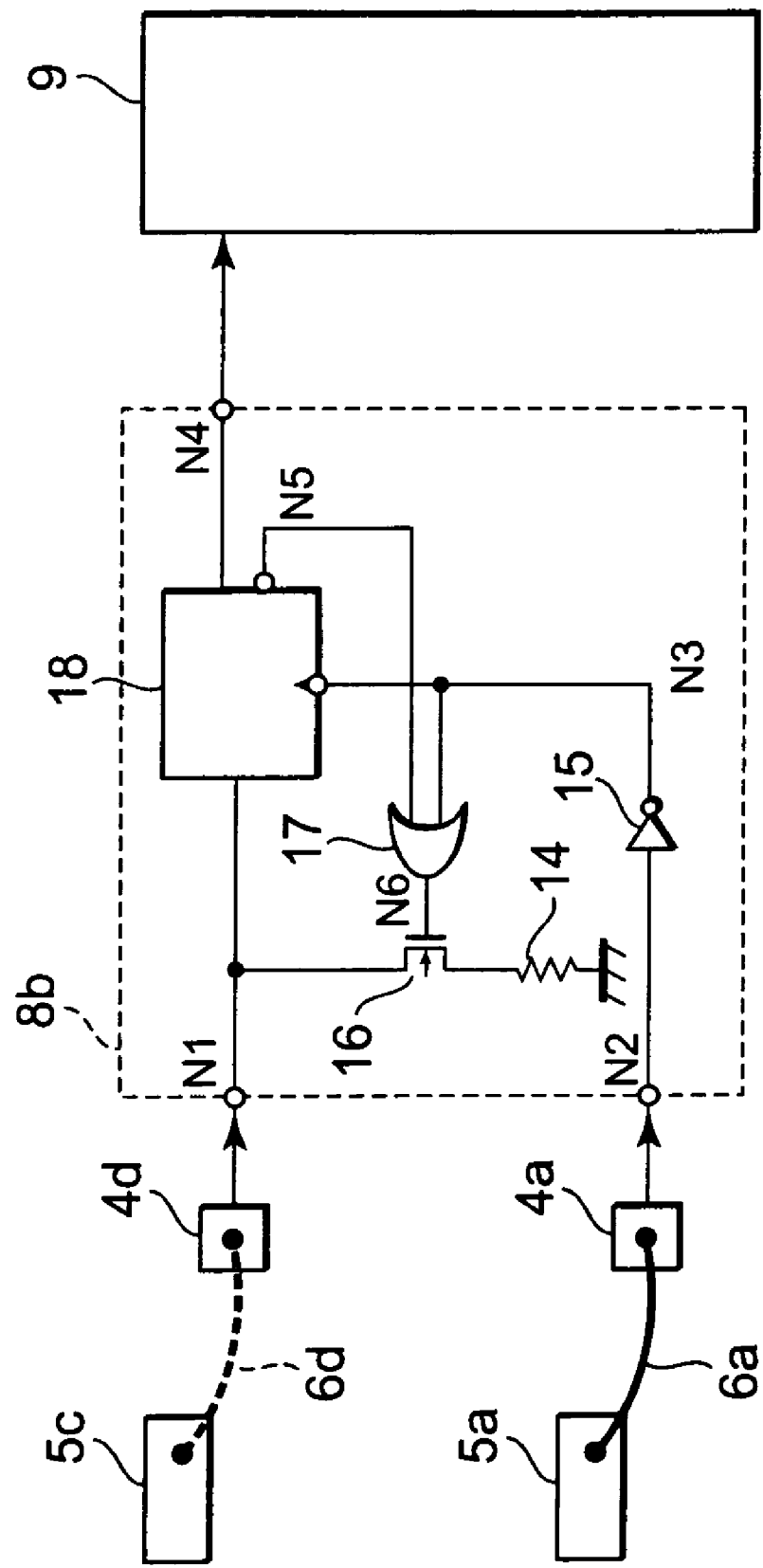
FIG. 12 is a circuit diagram of an operation mode selection circuit 8b according to the first embodiment of the present invention.
Figure 13:
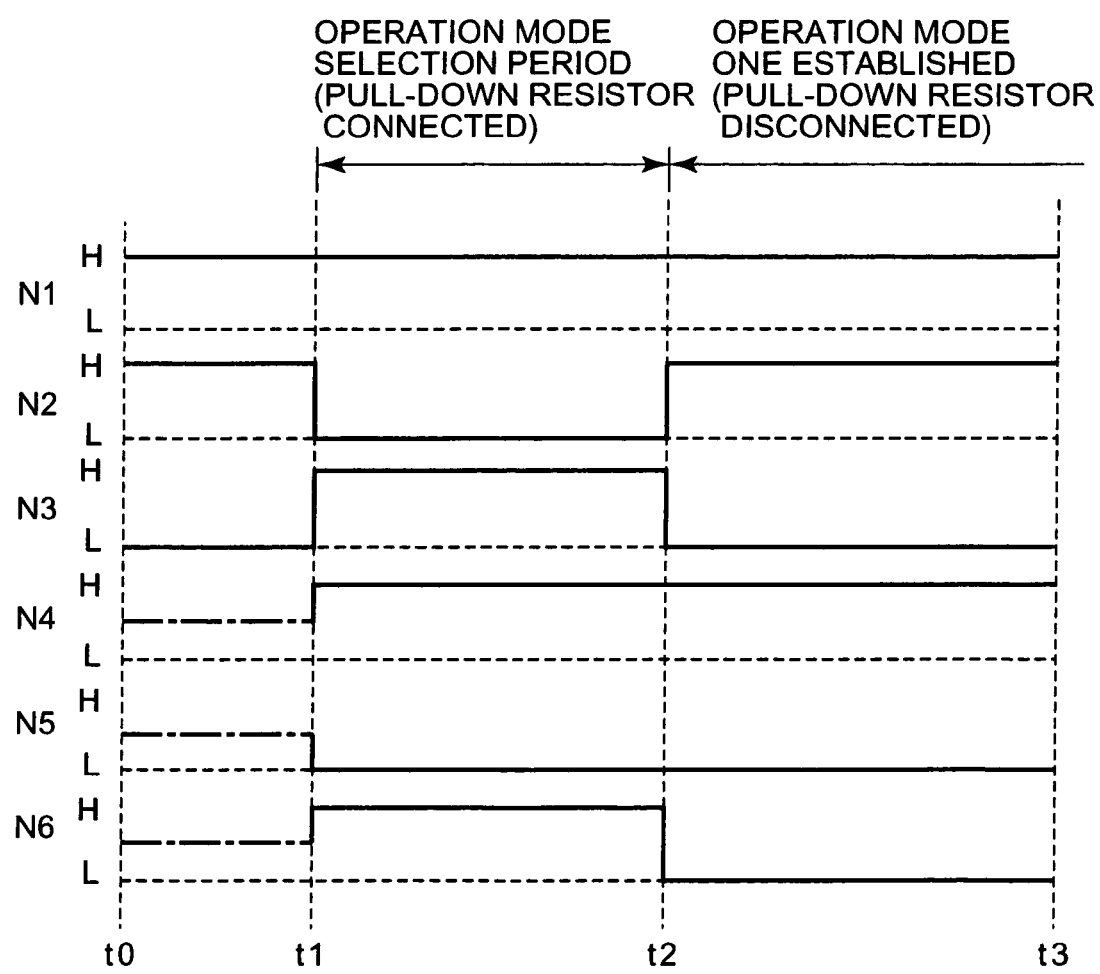
FIG. 13 is a timing chart illustrating the operation of the operation mode selection circuit 8b shown in FIG. 12.
Figure 14:
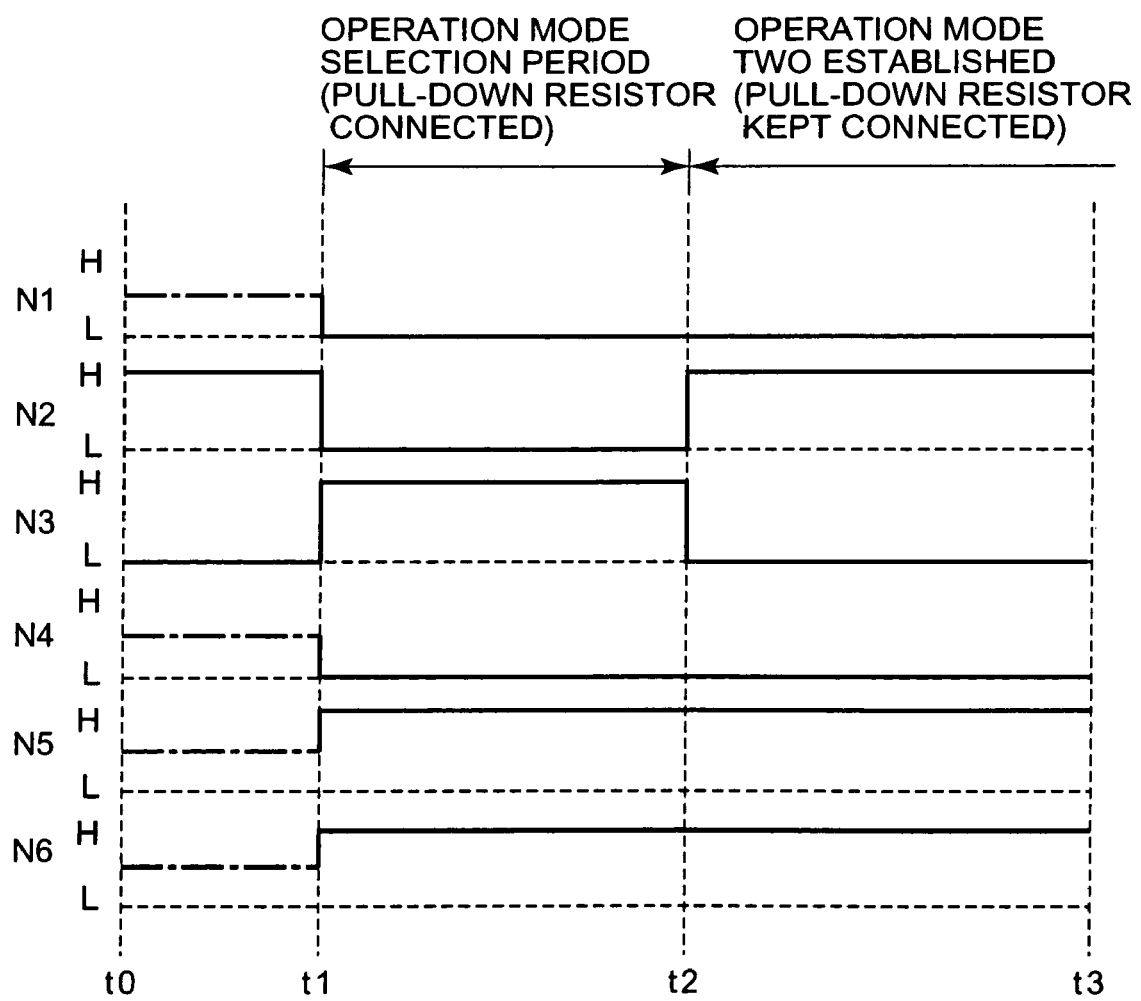
FIG. 14 is a timing chart illustrating the operation of the operation mode selection circuit 8b shown in FIG. 12.

Described next with reference to FIGS. 12 to 14 are the operation mode selection circuit 8 that is different from the one shown in FIG. 11 and operation of this circuit, which is denoted by 8a. FIG. 12 is a circuit diagram of the operation mode selection circuit 8b. Power supply relations (connections with the pad 4c and the pad 4e) are omitted from the circuit diagram.

The operation mode selection circuit 8b is composed of the pull-down resistor 14, an inverter 15, a switching circuit (N-channel (Nch) transistor) 16, a logical circuit (OR gate) 17, and a holding circuit 18. The pull-down resistor 14 is connected to the pad 4d through the Nch transistor 16. The inverter 15 is connected to the pad 4a, the OR gate 17; and the holding circuit 18 to receive a reset signal from the pad 4a and output a signal that is obtained by the logic inversion of the reset signal to the OR gate 17 and the holding circuit 18. An output of the inverter 15 and a signal obtained by the logic inversion of an output of the holding circuit 18 are input to the OR gate 17. The output of the OR gate 17 is connected to a gate of the Nch transistor 16. The input of the holding circuit 18 is connected to the pad 4d, and the output of the holding circuit 18 is connected to the functional block 9. The holding circuit 18 receives an L-level output of the inverter 15 and holds (latches) the output. When it is an H-level output that is received from the inverter 15, the holding circuit outputs the input value as it is (lets the signal pass through). The functional block 9 receives an output from the holding circuit 18 as an operation mode switching signal.

The operation of the operation mode selection circuit 8b is described next. FIG. 13 and FIG. 14 are timing charts illustrating the operation of the operation mode selection circuit 8b shown in FIG. 12.

FIG. 13 shows operation timing for a case where the lead 5c and the pad 4d are bonded to each other by the bonding wire 6d. The electric potential of the pad 4d (N1) which is connected to the lead 5c by the bonding wire 6d is one that indicates the H level throughout the entire period (t0~t3).

In a period t0~t1 where the reset signal (N2) is at the H level, the output (N3) of the inverter 15 is at the L level and the output (N4) of the holding circuit 18 is held (at an indefinite value). The signal (N5) obtained by the logic inversion of the output of the holding circuit 18 and the output (N6) of the OR gate 17 are therefore indefinite values.

At t1, the reset signal (N2) changes from the H level to the L level. Accordingly, the holding circuit 18 receives an H-level output (N3) of the inverter 15, the output (N4) of the holding circuit 18 is at the H level, and the signal (N5) obtained by the logic inversion of the output of the holding circuit 18 is at the L level. The OR gate 17 receives an H-level output (N3) of the inverter 15, which changes the output (N6) of the OR gate 17 to the H level. This turns the Nch transistor 16 ON, but the pad 4d (N1), which is bonded by the bonding wire 6d, remains at an electric potential that indicates the H level.

At t2, the reset signal (N2) changes from the L level to the H level, changing the output (N3) of the inverter 15 from the H level to the L level. The output (N4) of the holding circuit 18 is held as a result. In short, a period between t1 and t2 is an operation mode selection period where the pull-down resistor 14 is connected to the pad 4d, and the operation mode is established at the timing of t2. For example, when an H-level operation mode switching signal is to prompt a switch to Operation Mode One and an L-level operation mode switching signal is to prompt a switch to Operation Mode Two, the operation mode settles at Operation Mode One at t2 and the semiconductor device 1 operates in this mode from then on.

Besides, at t2, the output (N3) of the inverter 15 and the signal (N5) obtained by the logic inversion of the output of the holding circuit 18 are both changed to the L level. As a result, the output (N6) of the OR gate 17 changes to the L level and the Nch transistor 16 is turned OFF. In other words, when the pad 4d is bonded to the lead 5c by the bonding wire 6d, the pull-down resistor 14 is disconnected from the pad 4d at t2, where the operation mode is established, and subsequent periods.

In the case where the pad 4d is bonded by the bonding wire 6d, a power supply electric potential is supplied from the lead 5c to the pad 4d. Keeping the pull-down resistor 14 connected to the pad 4d in this case means that consumption current constantly flows from the pad 4d into the pull-down resistor 14. The pull-down resistor 14 cannot be set to a large resistivity above a certain level in consideration of noise resistance. In short, the operation mode selection circuit 8b can keep small the idle power consumption which is observed while the pad 4d is bonded by the bonding wire 6d.

FIG. 14 shows operation timing for a case where the lead 5c and the pad 4d are not bonded to each other by the bonding wire 6d. Unlike FIG. 13, the electric potential of the pad 4d (N1) in FIG. 14 does not keep indicating the same logical level throughout the entire period (t0~t3).

In a period t0~t1 where the reset signal (N2) is at the H level, the output (N3) of the inverter 15 is at the L level and the output (N4) of the holding circuit 18 is held (at an indefinite value). The signal (N5) obtained by the logic inversion of the output of the holding circuit 18 and the output (N6) of the OR gate 17 are therefore indefinite values.

At t1, the reset signal (N2) changes from the H level to the L level. Accordingly, the holding circuit 18 receives an H-level output (N3) of the inverter 15, the output (N4) of the holding circuit 18 is at the H level, and the signal (N5) obtained by the logic inversion of the output of the holding circuit 18 is at the L level. The OR gate 17 receives an H-level output (N3) of the inverter 15, which changes the output (N6) of the OR gate 17 to the H level. This turns the Nch transistor 16 ON, but the pad 4d (N), which is bonded by the bonding wire 6d, remains at an electric potential that indicates the H level.

At t2, the reset signal (N2) changes from the L level to the H level, changing the output (N3) of the inverter 15 from the H level to the L level. The output (N4) of the holding circuit 18 is held as a result. In short, a period between t1 and t2 is an operation mode selection period where the pull-down resistor 14 is connected to the pad 4d, and the operation mode is established at t2. For example, when an H-level operation mode switching signal is to prompt a switch to Operation Mode One and an L-level operation mode switching signal is to prompt a switch to Operation Mode Two, the operation mode settles at Operation Mode One at t2 and the semiconductor device 1 operates in this mode from then on.

While the output (N3) of the inverter 15 changes from the H level to the L level at t2, the signal (N5) obtained by the logic inversion of the output of the holding circuit 18 remains at the H level. The output (N6) of the OR gate 17 is therefore maintained at the H level and the Nch transistor 16 is kept turned ON. In other words, when the pad 4d is not bonded to the lead 5c by the bonding wire 6d, the pull-down resistor 14 is kept connected to the pad 4d in periods subsequent to t2, where the operation mode is established.

In the case where the pad 4d is bonded by the bonding wire 6d, the pad 4d is in an open state and causes malfunction. The operation mode selection circuit 8b is capable of preventing the pad 4d from being open when the pad 4d is not bonded by the bonding wire 6d with the use of the pull-down resistor 14. However, if unstableness is allowed in the electric potential from the pad 4d to the input of the holding circuit 18, the signal obtained by the logic inversion of the output of the holding circuit 18 does not need the feedback path to the OR gate 17.

In this way, the functional block 9 receives from the operation mode selection circuit 8b one of an H-level operation mode switching signal and an L-level operation mode switching signal which reflect the presence and absence of the bonding wire 6d, respectively, and activates a circuit that implements a specific function relevant to the selected operation mode.

As described above, according to the first embodiment of the present invention, the pad 4c and the operation mode selection pad 4d are positioned in relation to each other such that the distance L2 from the center of the pad 4d to the center of the pad 4c connected to the lead 5c, which is in some cases connected to the pad 4d, is smaller than the distance L1 between normal pads (=other pads than the pads 4c and 4d), for example, the distance from the center of the pad 4a to the center of the pad 4b. With the pads placed along the perimeter of the chip in this manner, the length of the periphery of the chip which is determined by the number of the pads can be cut short by L1−L2. Specifically, when a product whose chip size is determined by the number of pads required to be placed along the perimeter of the chip is to meet users' individual requests by adding a mode pad, the chip can therefore be smaller in area according to the present invention where a mode pad (the pad 4d) and an adjacent pad (the pad 4c) connected to a lead that is in some cases connected to the mode pad are at the distance L2 from each other, than in a case where those pads are spaced apart by the distance L1.

The distance from the center of one normal pad to the center of another normal pad, which is L1 for all the normal pads in the first embodiment of the present invention, does not necessarily be uniform. The distance between the centers of normal pads can be varied if it is at least longer than the distance L2 and does not cause a loose connection.

The distance from the center of the pad 4b to the center of the pad 4c, and the distance from the center of the pad 4d to the center of the pad 4e are not clearly defined in FIG. 2 and other drawings. However, a contact between the bonding wires 6 that are connected to those pads causes a problem, and the pads 4b to 4e therefore need to be spaced apart by a distance equal to the distance L1.

The pads 4 connected to the lead 5c in the first embodiment of the present invention are the pads 4c and 4d as shown in FIG. 2 and other drawings, but are not limited to this combination. Besides, while the first embodiment shows an example in which the pad 4c and the pad 4d are aligned in a direction parallel to one side of the chip 2 beside which the lead 5c is placed (H1 of FIG. 2), the pads 4c and the pad 4d are not limited to this arrangement. Various modification examples can be thought of without departing from the spirit of the present invention. Representative modification examples will be described with reference to FIGS. 15 to 24.

Figure 15:
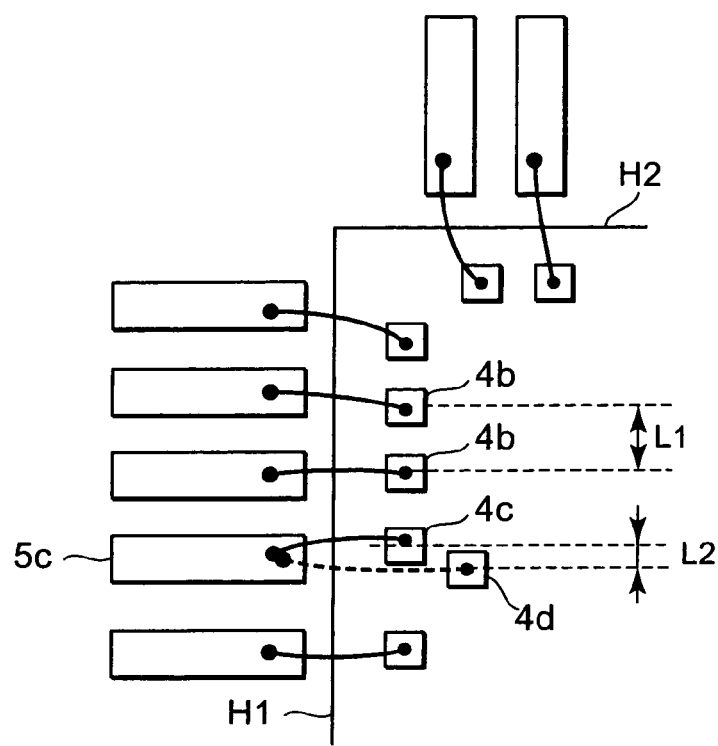
FIG. 15 is a diagram illustrating a modification example of the first embodiment of the present invention.

FIG. 15 shows a case in which the pad 4c and the pad 4d are arranged in a zigzag alignment. The pad 4d in FIG. 15 is closer to the central area of the chip than the pad 4c is. The distance from the center of the pad 4c to the center of the pad 4d in this case can be reduced even more than in, for example, FIG. 2. With the pads arranged as in FIG. 15, the length of the periphery of the chip which is determined by the number of the pads can therefore be made even shorter than when the pads are arranged as in FIG. 2. The pad arrangement in FIG. 15 may be conversed so that the pad 4c is nearer to the central area of the chip than the pad 4d is. The distance from the center of the pad 4c to the center of the pad 4d in a direction perpendicular to (a direction horizontal to a side H2 of the chip shown in FIG. 15) one side (H1 in FIG. 15) of the chip 2 beside which the lead 5c is placed may be L2.

Figure 16:
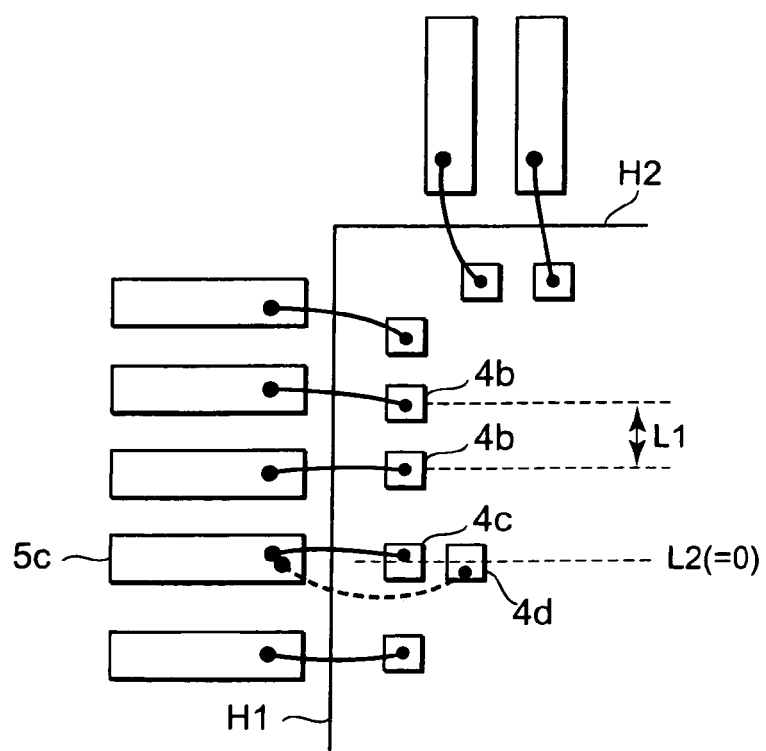
FIG. 16 is a diagram illustrating another modification example of the first embodiment of the present invention.

FIG. 16 shows a case in which the pad 4c and the pad 4d are exactly flush with each other in a direction horizontal to one side (H1 in FIG. 16) of the chip 2 beside which the lead 5c is placed, thereby forming two rows. When only components in a direction parallel to one side (H1 in FIG. 16) of the chip 2 beside which the lead 5c is placed are to be considered, L2=0 as shown in FIG. 16. It is therefore sufficient if the distance L2 satisfies $0 \leq L2 < L1$. Since the pad arrangement shown in FIG. 16 sets L2 to 0, the length of the periphery of the chip which is determined by the number of the pads in FIG. 16 can be made even shorter than in FIG. 15.

Figure 17:
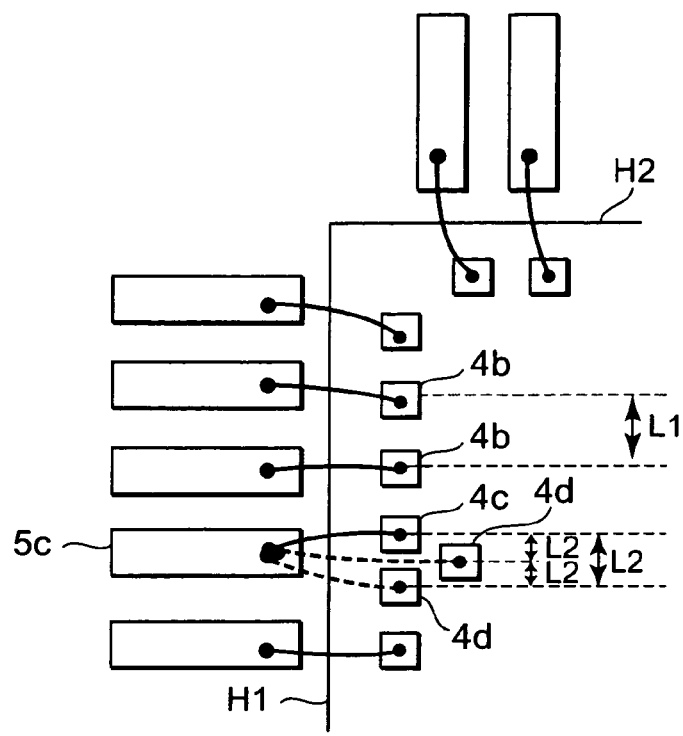
FIG. 17 is a diagram illustrating still another modification example of the first embodiment of the present invention.

FIG. 17 shows a case in which two pads 4d are installed to be bonded to the lead 5c. In FIG. 17, the distance L2 is set as the distance from the center of the pad 4c to the center of one pad 4d and as the distance from the center of this pad 4d to the center of another pad 4d. With two pads 4d (mode pads), a selection can be made from four different operation modes at maximum. The number of the pads 4d may be three or more, and the pads 4d may not be arranged in a zigzag pattern of FIG. 17.

Figure 18:
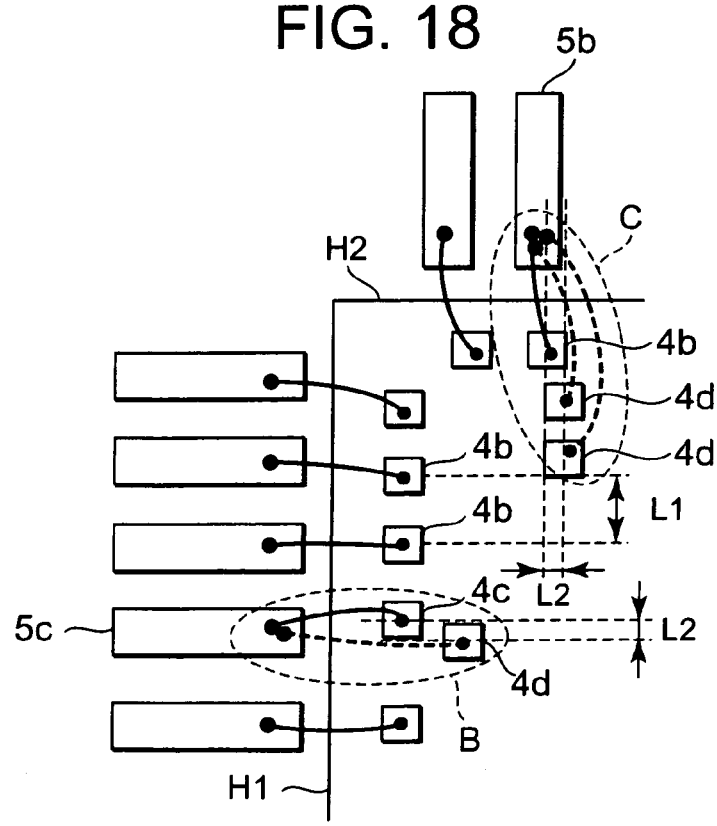
FIG. 18 is a diagram illustrating yet still another modification example of the first embodiment of the present invention.

FIG. 18 shows an example in which the pads 4d (mode pads) are located at multiple points on the chip 2. The pads 4d in FIG. 18 are present in regions B and C, which are circled by the dotted lines. The region B contains the pad 4c and the pad 4d that are bonded (or, bonded in some cases and not bonded in other cases) to the lead 5c. The region C contains the pad 4b and (two) pads 4d that are bonded (or, bonded in some cases and not bonded in other cases) to the lead 5b. When multiple mode pads are installed, the mode pads may be bonded separately to different leads as in this example. The region B which contains one mode pad (pad 4d) provides two operation mode options. On the other hand, the region C which contains two mode pads (pads 4d) provides four operation mode options. Accordingly, in the example of FIG. 18, a selection can be made from six different operation modes in total.

In the region B, the distance L2 from the center of the pad 4c to the center of the pad 4d is in a direction horizontal to one side (H1 in FIG. 18) of the chip 2 beside which the lead 5c is placed. In the region C, the distance L2 from the center of the pad 4c to the center of one pad 4d is in a direction horizontal to one side (H2 in FIG. 18) of the chip 2 beside which the lead 5b is placed. Thus, depending on in which part of the chip 2 the pads 4 are placed, the direction of the distance L2 is varied which is a direction horizontal to one side of the chip 2 beside which the lead 5 bonded to the pads 4 by bonding wires is placed, namely, a direction horizontal to one side of the perimeter of the chip 2 where the pad 4c or the pad 4d is placed. In FIG. 18, the leads and pads contained in the region B are located beside H1 and the leads and pads contained in the region C are located beside H2.

The lead that is in some cases connected to the mode pads (pads 4d) in the region C is the lead 5b for communicating input/output signals, instead of the lead 5c for supplying a power supply electric potential. While the above description employs the lead 5c as a lead that is in some cases connected to the mode pad (pad 4d), the present invention is not limited thereto.

In the case where the lead 5b for communicating input/output signals is a lead that is in some cases connected to the mode pad (pad 4d), attention must be paid to changes in logical level of a signal input from the lead 5b. Specifically, whether an operation mode is chosen at the H level or the L level needs to be determined in advance. In the case where an operation mode is to be chosen at the H level, the operation mode selection circuit 8 can have the same structure (FIGS. 11 and 12) as is the case for a lead connected to the power supply pad (pad 4c), without causing a problem. In the case where in an operation mode is to be chosen at the L level, on the other hand, modifications are necessary such as replacing the pull-down resistor 14 of FIG. 11 and FIG. 12 with a pull-up resistor and inverting the logic of the circuit operation.

In the above description, the lead 5b functions as an input terminal, in other words, the pad 4b (signal pad) contained in the region C functions as an input terminal when an operation mode is selected. Alternatively, the pad 4b may also function as an output terminal in operation mode selection. This is accomplished by structuring the semiconductor device 1 such that a signal indicating a given logical level is output from the internal circuit 7 to the pad 4b. Other than the lead 5b, the lead 5a or the lead 5d may be a lead that is in some cases connected to the mode pad (pad 4d).

Figure 19:
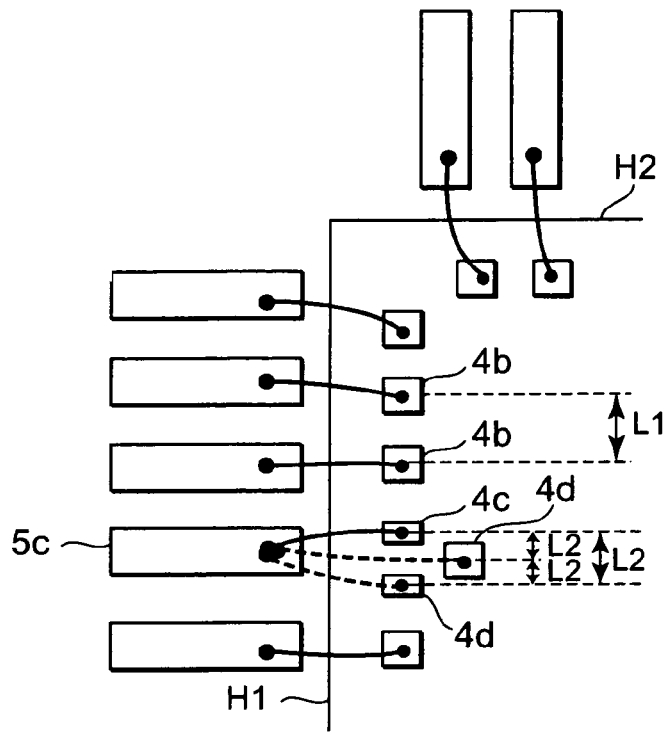
FIG. 19 is a diagram illustrating yet still another modification example of the first embodiment of the present invention.

FIG. 19 shows a case in which some of the pads 4c and 4d that are connected (or, connected in some cases and not connected in other cases) to the lead 5c are smaller in size. In FIG. 19, the pad 4c and one of the pads 4d are smaller in size than other pads so-called normal pads (for example, the pads 4b of FIG. 19). The another pad 4d is the same size as the another pads called normal pads. The pad 4c and two pads 4d may be arranged in a zigzag alignment as shown in FIG. 19.

Figure 20:
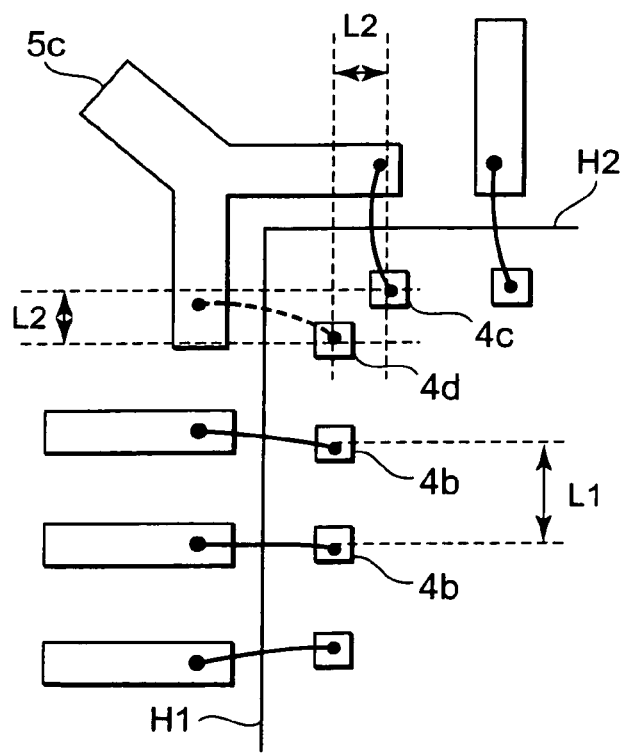
FIG. 20 is a diagram illustrating yet still another modification example of the first embodiment of the present invention.

FIG. 20 shows a case in which a Y-shaped lead is employed to place the mode pad (pad 4d) in a corner of the chip 2. While the leads 5 in the above description all have a linear shape and are arranged at regular intervals from each other, a Y-shaped lead as the one shown in FIG. 20 may also be employed. In FIG. 20, the Y-shaped lead 5c is placed such that the two arms of the Y are aligned with two sides of the chip that meet in a corner of the chip. The pad 4c which is bonded to the Y-shaped lead 5c and the pad 4d which is in some cases bonded to the Y-shaped lead 5c are therefore placed along two different sides (two sides of the chip 2 that form a corner) of the perimeter of the chip 2. The pad 4c and the pad 4d in this case are spaced apart by the distance L2 in a direction horizontal to one of the two sides of the chip 1, the side H1 in FIG. 20, and in a direction horizontal to the other of the two sides of the chip 2, the side H2 in FIG. 20, respectively. When the pad 4c and the pad 4d are placed in a corner of the chip 2 as in this example, it is considered that the pad 4c and the pad 4d are placed along the perimeter of the chip 2 to separately surface the two sides that form the corner.

Figure 21:
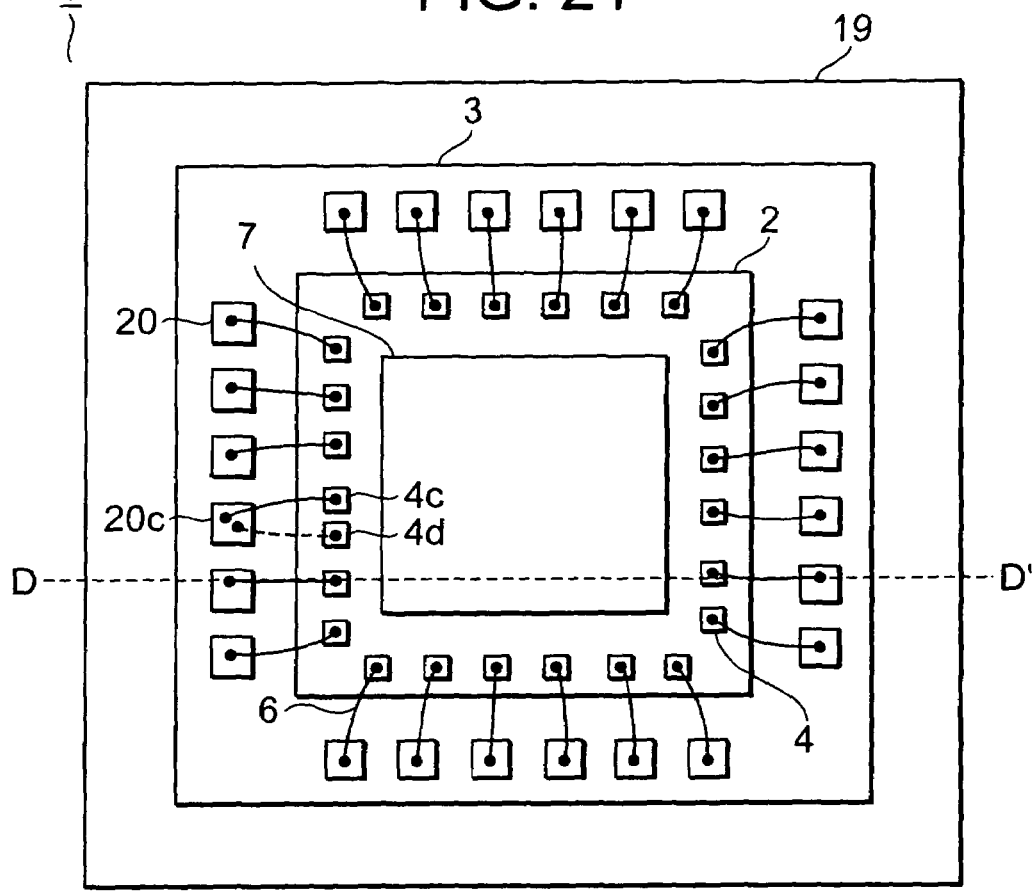
FIG. 21 is a diagram illustrating yet still another modification example of the first embodiment of the present invention.
Figure 22:
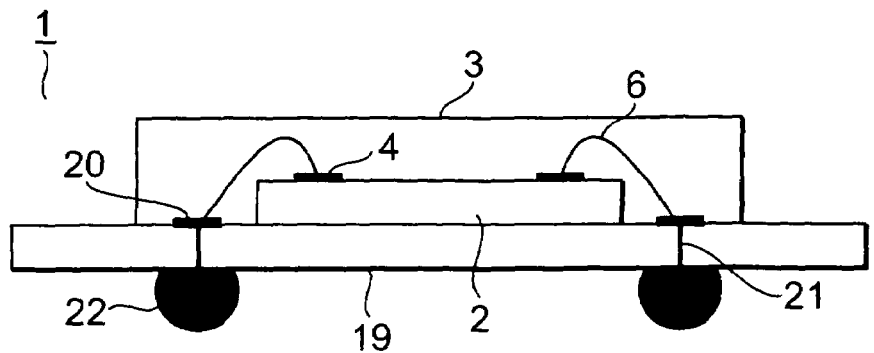
FIG. 22 is a cross sectional view along line D-D' in FIG. 21.

FIGS. 21 and 22 show a case of applying the present invention to a wire connection type ball grid array (BGA) package. FIG. 21 is a plan view of the chip 2 viewed from above, and FIG. 22 is a sectional view taken along the line D-D' of FIG. 21. While external terminals in the above description are leads, conductor patterns arranged on a printed board 19 may serve as external terminals as shown in FIGS. 21 and 22.

As shown in FIGS. 21 and 22, the semiconductor device 1 is structured such that a half of the printed board 19 is covered with the mold resin 3 to cover the chip 2 mounted onto the printed board 19. The conductor patterns (external terminals) 20 are arranged on the printed board 19, and are bonded to the pads 4, which are on the chip 2, by the bonding wires 6. The pad 4c and the pad 4d which are relevant to operation mode selection are connected to a conductive pattern 20c. The conductor patterns 20 are connected to solder balls 22 through printed wiring lines 21.

Figure 23:
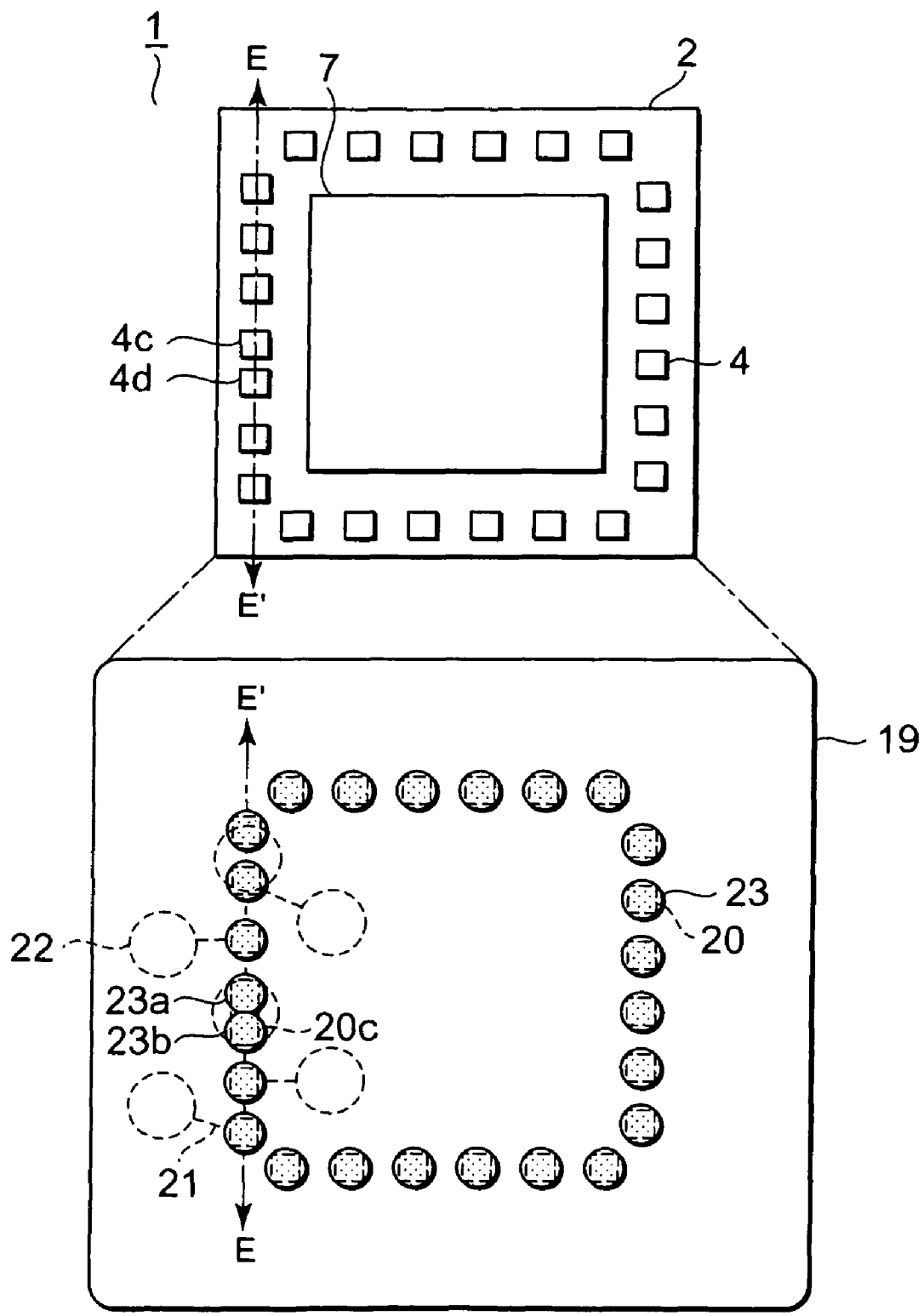
FIG. 23 is a diagram illustrating yet still another modification example of the first embodiment of the present invention.
Figure 24:
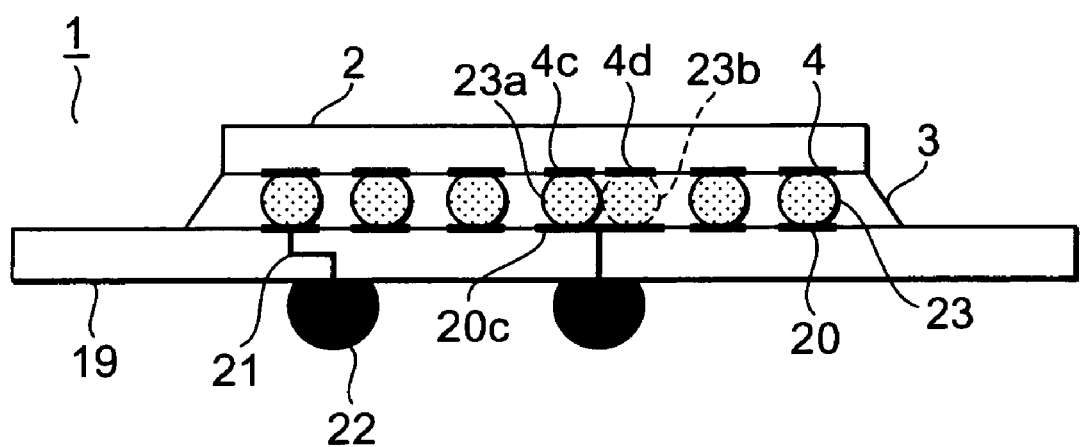
FIG. 24 is a cross sectional view along line E-E' in FIG. 23.

FIGS. 23 and 24 show a case of applying the present invention to a flip chip connection type BGA package. FIG. 23 is a plan view showing the chip 2 and the printed board 19 (+bumps 23) separately, and FIG. 24 is a sectional view taken along the line E-E' of FIG. 23. Note that the chip 2 and the printed board 19 shown in FIG. 23 are stuck together through the bumps 23 such that E and E' of the chip 2 coincide with E and E' of the printed board 19, respectively. While the external terminals (leads 5, conductor patterns 20) and the internal terminals (pads 4) in the above description are bonded to each other by the bonding wires 6, measures other than wires may be employed to connect the internal terminals and the external terminals to each other as shown in FIGS. 23 and 24.

As shown in FIGS. 23 and 24, the chip 2 is mounted as a flip chip to the printed board 19 to structure the semiconductor device 1. The bumps 23 are sandwiched between the pads 4 formed on the chip 2 and the conductor patterns 20 formed on the printed board 19, and electrically connect the pads 4 and the conductor patterns 20. The mold resin 3 is filled between the chip 2 and the printed board 19. The conductor patterns 20 are connected to the solder balls 22 through the printed wiring lines 21.

As shown in FIGS. 23 and 24, the pad 4c is connected to the conductor pattern 20c by a bump 23a. The pad 4d, which is a mode pad, is connected to the conductor pattern 20c by a bump 23b. In other words, the bump 23b is present when an external terminal is bonded to the pad 4d and is absent when no external terminal is bonded to the pad 4d. An operation mode can be selected based on the presence or absence of the bump 23b. With the pad 4c and the pad 4d at the distance L2 from each other, the bump 23b when present could come into contact with the bump 23a. However, a contact between the bumps 23a and 23b does not cause a problem.

Although the invention has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A semiconductor device comprising:
a substrate;
a first internal terminal, a second internal terminal, a third internal terminal, and a fourth internal terminal which are placed along perimeter of the substrate;
a circuit formed on the substrate and coupled to the first internal terminal;
a first external terminal coupled to the second internal terminal;
a second external terminal coupled to the third internal terminal; and
a third external terminal coupled to the fourth internal terminal and placed beside one side of the substrate where the second external terminal is located,
wherein the circuit outputs a signal indicative of a connection state between the first internal terminal and the first external terminal,
wherein a distance between centers of the first internal terminal and the second internal terminal is L1 in a direction parallel to one side of the substrate beside which the first external terminal is placed,
wherein a distance between centers of the third internal terminal and the fourth internal terminal is L2 in a direction parallel to the one side of the substrate beside which the second external terminal and the third external terminal are placed, and
wherein the distance L1 is smaller than the distance L2.

2. The semiconductor device according to claim 1,
wherein the first internal terminal, the second internal terminal, the third internal terminal, and the fourth internal terminal each contains a pad,
wherein the pads of the first internal terminal and the second internal terminal each has a width W1 in the direction parallel to the one side of the substrate beside which the first external terminal is placed,
wherein the pads of the third internal terminal and the fourth internal terminal each has a width W2 in the direction parallel to the one side of the substrate beside which the second external terminal and the third external terminal are placed,
wherein a distance from a pad end of the first internal terminal to an adjacent pad end of the second internal terminal is D1 in the direction parallel to the one side of the substrate beside which the first external terminal is placed,
wherein a distance from a pad end of the third internal terminal to an adjacent pad end of the fourth internal terminal is D2 in the direction parallel to the one side of the substrate beside which the second external terminal and the third external terminal are placed, and
wherein the distance D1 is smaller than the distance D2 when the width W1 is equal to the width W2.

3. The semiconductor device according to claim 1,
wherein the first internal terminal, the second internal terminal, the third internal terminal, and the fourth internal terminal each contains a pad,
wherein the pads of the first internal terminal and the second internal terminal each has a width W1 in the direction parallel to the one side of the substrate beside which the first external terminal is placed,
wherein the pads of the third internal terminal and the fourth internal terminal each has a width W2 in the direction parallel to the one side of the substrate beside which the second external terminal and the third external terminal are placed, wherein a distance from a pad end of the first internal terminal to an adjacent pad end of the second internal terminal is D1 in the direction parallel to the one side of the substrate beside which the first external terminal is placed, wherein a distance from a pad end of the third internal terminal to an adjacent pad end of the fourth internal terminal is D2 in the direction parallel to the one side of the substrate beside which the second external terminal and the third external terminal are placed, and wherein the width W1 is smaller than the width W2 when the distance D1 is equal to the distance D2.

4. The semiconductor device according to claim 1, wherein the first internal terminal and the second internal terminal are arranged to form two rows in a direction perpendicular to the one side of the substrate beside which the first external terminal is placed.

5. The semiconductor device according to claim 4, wherein the first internal terminal and the second internal terminal are arranged in a zigzag alignment.

6. The semiconductor device according to claim 1, further comprising a fifth internal terminal formed on the substrate and coupled to the circuit, wherein the circuit outputs a signal indicative of a connection state between the fifth internal terminal and the first external terminal, wherein one of a distance between centers of the first internal terminal and the fifth internal terminal, and a distance between centers of the second internal terminal and the fifth internal terminal, is L3 in the direction parallel to the one side of the substrate beside which the first external terminal is placed, and wherein the distance L3 is smaller than the distance L2.

7. The semiconductor device according to claim 1, further comprising:

a fourth external terminal;

a fifth internal terminal formed on the substrate and coupled to the circuit; and a sixth internal terminal formed on the substrate and coupled to the fourth external terminal, wherein the circuit outputs a signal indicative of a connection state between the fifth internal terminal and the fourth external terminal, wherein a distance between centers of the fifth internal terminal and the sixth internal terminal is L3 in a direction parallel to one side of the substrate beside which the fourth external terminal is placed, and wherein the distance L3 is smaller than the distance L2.

8. The semiconductor device according to claim 1, wherein, when the first internal terminal and the second internal terminal are placed in a corner of a top surface of the substrate, a relation that the distance L1 is smaller than the distance L2 is satisfied for each of two sides of the substrate that form the corner.

9. The semiconductor device according to claim 1, wherein the first external terminal includes a first lead frame coupled to the second internal terminal by a first wire, wherein the second external terminal includes a second lead frame coupled to the third internal terminal by a second wire, and wherein the third external terminal includes a third lead frame coupled to the fourth internal terminal by a third wire.

10. The semiconductor device according to claim 1, wherein the substrate is a first substrate, wherein the semiconductor device further comprises a second substrate, wherein the first substrate is laid on top of the second substrate, wherein the first external terminal is formed on the second substrate and includes a first conductor pattern coupled to the second internal terminal by a first wire, wherein the second external terminal is formed on the second substrate and includes a second conductor pattern coupled to the third internal terminal by a second wire, and wherein the third external terminal is formed on the second substrate and includes a third conductor pattern coupled to the fourth internal terminal by a third wire.

11. The semiconductor device according to claim 1, wherein the substrate is a first substrate, wherein the semiconductor device further comprises a second substrate, wherein the first substrate is connected to the second substrate by a flip chip connection, wherein the first external terminal is formed on the second substrate and includes a first conductor pattern coupled to the second internal terminal by a first bump, wherein the second external terminal is formed on the second substrate and includes a second conductor pattern coupled to the third internal terminal by a second bump, and wherein the third external terminal is formed on the second substrate and includes a third conductor pattern coupled to the fourth internal terminal by a third bump.

12. A semiconductor device comprising:

a substrate;

a first internal terminal, a second internal terminal, a third internal terminal, and a fourth internal terminal which are placed along perimeter of the substrate; and a circuit formed on the substrate and coupled to the first internal terminal, wherein the first internal terminal and the second internal terminal are connectable to a first external terminal, wherein the third internal terminal is connectable to a second external terminal, wherein the fourth internal terminal is connectable to a third external terminal, wherein the circuit outputs a signal indicative of a connection state between the first internal terminal and the first external terminal, wherein a distance between centers of the first internal terminal and the second internal terminal is L1 in a direction parallel to one side of the perimeter of the substrate where one of the first internal terminal and the second internal terminal is placed, wherein a distance between centers of the third internal terminal and the fourth internal terminal is L2 in a direction parallel to one side of the perimeter of the substrate where the third internal terminal and the fourth internal terminal are placed, and wherein the distance L1 is smaller than the distance L2.

13. The semiconductor device according to claim 12, wherein the first internal terminal, the second internal terminal, the third internal terminal, and the fourth internal terminal each contains a pad, wherein the pads of the first internal terminal and the second internal terminal each has a width W1 in the direction parallel to the one side of the perimeter of the substrate where one of the first internal terminal and the second internal terminal is placed, wherein the pads of the third internal terminal and the fourth internal terminal each has a width W2 in the direction parallel to the one side of the perimeter of the substrate where the third internal terminal and the fourth internal terminal are placed, wherein a distance from a pad end of the first internal terminal to an adjacent pad end of the second internal terminal is D1 in the direction parallel to the one side of the perimeter of the substrate where one of the first external terminal and the second external terminal is placed, wherein a distance from a pad end of the third internal terminal to an adjacent pad end of the fourth internal terminal is D2 in the direction parallel to the one side of the perimeter of the substrate where the third and fourth external terminals are placed, and wherein the distance D1 is smaller than the distance D2 when the width W1 is equal to the width W2.

14. The semiconductor device according to claim 12, wherein the first internal terminal, the second internal terminal, the third internal terminal, and the fourth internal terminal each contains a pad, wherein the pads of the first internal terminal and the second internal terminal each has a width W1 in the direction parallel to the one side of the perimeter of the substrate where one of the first internal terminal and the second internal terminal is placed, wherein the pads of the third internal terminal and the fourth internal terminal each has a width W2 in the direction parallel to the one side of the perimeter of the substrate where the third internal terminal and the fourth internal terminal are placed, wherein a distance from a pad end of the first internal terminal to an adjacent pad end of the second internal terminal is D1 in the direction parallel to the one side of the perimeter of the substrate where one of the first external terminal and the second external terminal is placed, wherein a distance from a pad end of the third internal terminal to an adjacent pad end of the fourth internal terminal is D2 in the direction parallel to the one side of the perimeter of the substrate where the third external terminal and the fourth external terminal are placed, and wherein the width W1 is smaller than the width W2 when the distance D1 is equal to the distance D2.

15. The semiconductor device according to claim 12, wherein the first internal terminal and the second internal terminal are arranged to form two rows in a direction perpendicular to the one side of the perimeter of the substrate where one of the first internal terminal and the second internal terminal is placed.

16. The semiconductor device according to claim 15, wherein the first internal terminal and the second internal terminal are arranged in a zigzag alignment.

17. The semiconductor device according to claim 12, further comprising a fifth internal terminal formed on the substrate and being connectable to the first external terminal, wherein the circuit outputs a signal indicative of a connection state between the fifth internal terminal and the first external terminal, wherein one of a distance between centers of the first internal terminal and the fifth internal terminal, and a distance between centers of the first internal terminal and the fifth internal terminal, is L3 in the direction parallel to the one side of the perimeter of the substrate where one of the first internal terminal and the second internal terminal is placed, and wherein the distance L3 is smaller than the distance L2.

18. The semiconductor device according to claim 12, further comprising:

a fifth internal terminal formed on the substrate and being connectable to a fourth external terminal; and a sixth internal terminal formed on the substrate and being connectable to the fourth external terminal, wherein the circuit outputs a signal indicative of a connection state between the fifth internal terminal and the fourth external terminal, wherein a distance between centers of the fifth internal terminal and the sixth internal terminal is L3 in a direction parallel to one side of the perimeter of the substrate where one of the fifth internal terminal and the sixth internal terminal is placed, and wherein the distance L3 is smaller than the distance L2.

19. The semiconductor device according to claim 12, wherein, when the first internal terminal and the second internal terminal are placed in a corner of a top surface of the substrate, a relation that the distance L1 is smaller than the distance L2 is satisfied for each of two sides of the substrate that form the corner.

* * * * *